(12) United States Patent
Fujinaga

(10) Patent No.: US 7,095,118 B2
(45) Date of Patent: *Aug. 22, 2006

(54) HIGH-FREQUENCY SEMICONDUCTOR DEVICE WITH NOISE ELIMINATION CHARACTERISTIC

(75) Inventor: Masato Fujinaga, Tokyo (JP)

(73) Assignee: Renesas Technology Corp., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/977,274

(22) Filed: Oct. 16, 2001

(65) Prior Publication Data
US 2002/0056920 A1 May 16, 2002

(30) Foreign Application Priority Data
Nov. 16, 2000 (JP) .............................. P2000-349807

(51) Int. Cl.
*H01L 23/48* (2006.01)
(52) U.S. Cl. ...................................... 257/758; 257/774
(58) Field of Classification Search ................ 257/758, 257/774, 778
See application file for complete search history.

(56) References Cited

U.S. PATENT DOCUMENTS 5,198,380 A * 3/1993 Harari ........................ 438/257
5,784,311 A * 7/1998 Assaderaghi et al. ....... 365/150
6,329,680 B1 * 12/2001 Yoshida et al. .............. 257/296

FOREIGN PATENT DOCUMENTS

JP 6-21634 8/1994
KR 1999-73868 10/1999

OTHER PUBLICATIONS

The American Heritage® Dictionary of the English Language, Third Edition copyright © 1992 by Houghton Mifflin Company. Electronic version licensed from INSO Corporation.*

* cited by examiner

Primary Examiner—Leonardo Andujar
(74) Attorney, Agent, or Firm—McDermott Will & Emery LLP

(57) ABSTRACT

The object of the present invention is to implement an enhancement in a noise eliminating characteristic of a wiring compatibly with promotion of microfabrication and simplification of a manufacturing process. Upper and side surfaces of a wiring (6) for transmitting a signal are continuously covered by a conductor layer (12) with insulators (7), (8) and (9) interposed therebetween in a section crossing a direction of extension thereof, and the conductor layer (12) is connected to a semiconductor substrate (1). Moreover, a periphery of a wiring (15) for transmitting a signal is continuously covered by the conductor layer (12) and a conductor layer (19) with insulators (14), (16), (17) and (18) interposed therebeween in a section crossing a direction of extension thereof. The wiring (15) is electrically connected to the semiconductor substrate (1) through a conductive plug (13) filled in a contact hole (24) formed in the conductor layer (12).

1 Claim, 18 Drawing Sheets

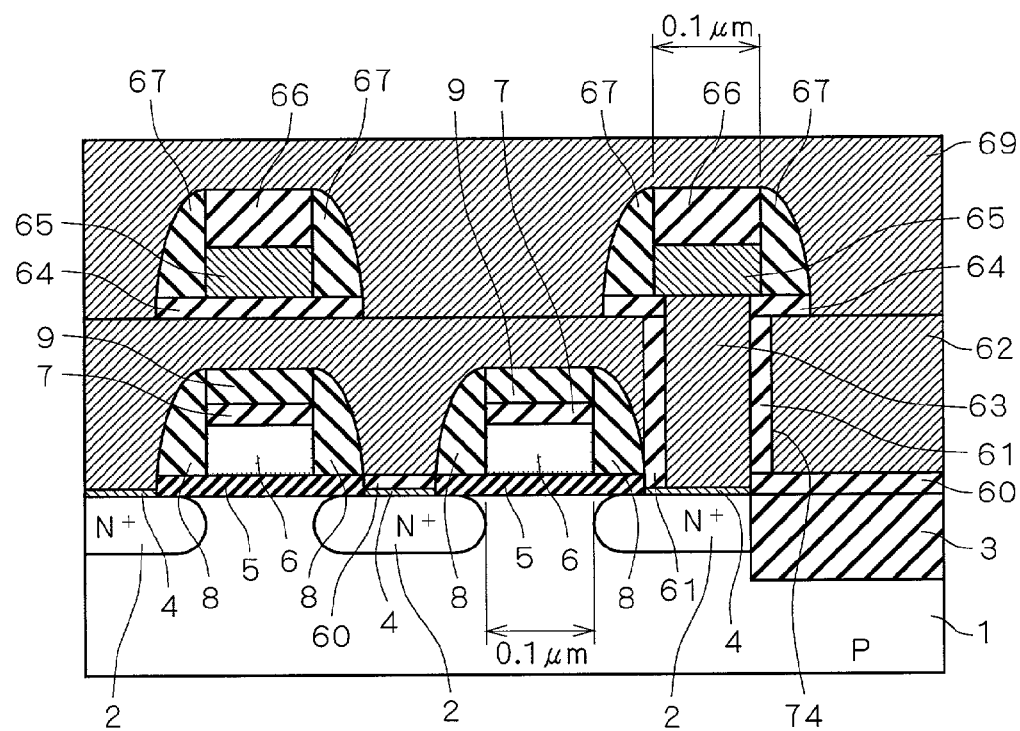
F I G . 14

F I G . 2 7
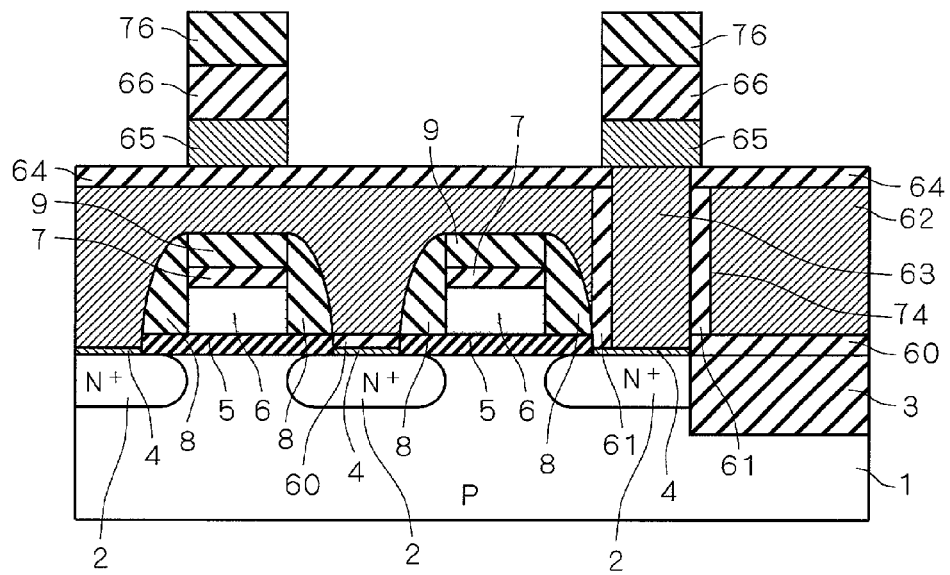
F I G . 2 8
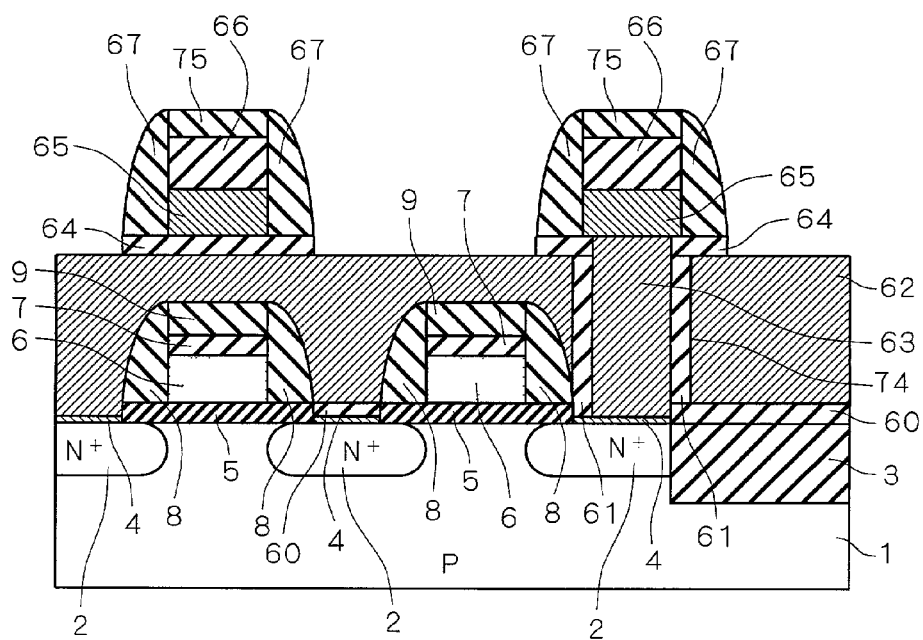

MICRO-STRIP LINE

STACKED PAIR LINE

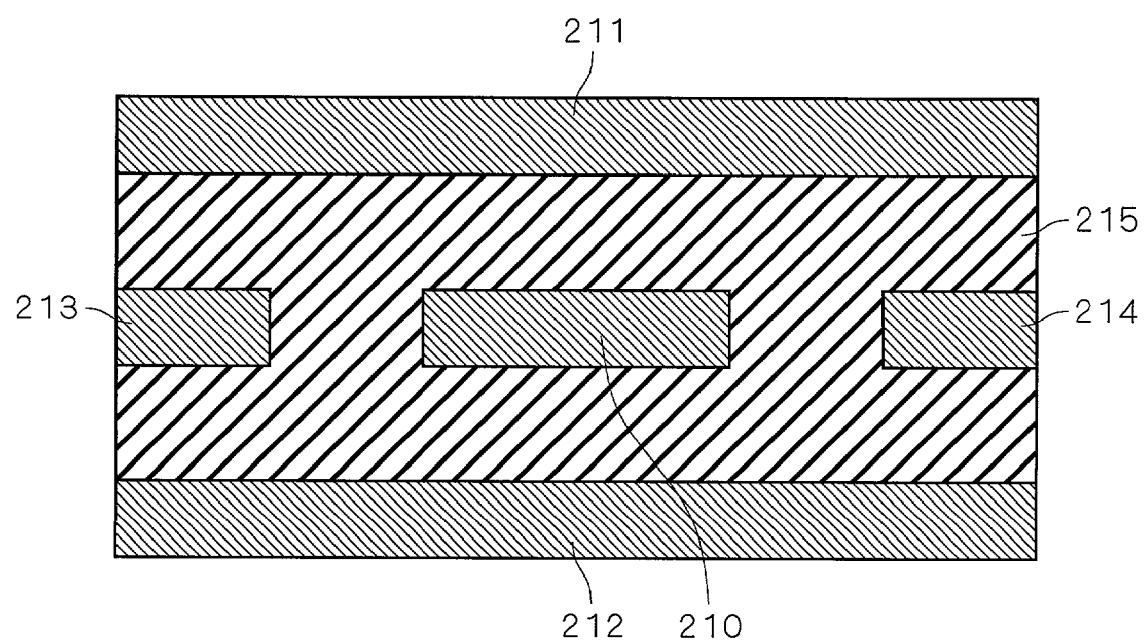
F I G . 3 3

HIGH-FREQUENCY SEMICONDUCTOR DEVICE WITH NOISE ELIMINATION CHARACTERISTIC

BACKGROUND OF THE INVENTION

1. Field of the Invention

The present invention relates to a semiconductor device and a method of manufacturing the semiconductor device, and more particularly to an improvement for implementing an enhancement in a noise eliminating characteristic of a wiring compatibly with promotion of microfabrication and simplification of a manufacturing process.

2. Description of the Background Art

FIGS. 31 and 32 are sectional views showing a wiring structure for a high frequency used in a conventional semiconductor device which has been described in the document (Y. Odate, T. Usami, K. Otsuka, T. Suga, "A measurement and simulation study of transmission lines on micro-strip and stacked-pair structure for high speed signals," Proc. Electronic Components & technology Conference, pp. 526–529, May 2000.), illustrating a micro-strip line and a stacked pair line which are provided over a semiconductor substrate, respectively. In the micro-strip line, a grounding conductor 203 is formed under a transmission line 201. Consequently, an electromagnetic field is collected into the grounding conductor 203. For this reason, a characteristic for eliminating the influence of a noise between the transmission line 201 and another transmission line 202 (that is, a noise eliminating characteristic) can be enhanced.

However, there has been a problem in that the noise eliminating characteristic is deteriorated if the transmission line 202 excessively approaches the transmission line 201, and therefore instead, a stacked pair line structure has been proposed. In the stacked pair line structure, the transmission line 201 and a grounding conductor 204 which have widths and thicknesses equal to each other are provided to make a pair so that an electromagnetic field is caused to converge. Consequently, the noise eliminating characteristic can be enhanced.

Also in the stacked pair line, however, there has been a problem in that the noise eliminating characteristic cannot be sufficiently obtained between the transmission line 201 and another transmission line arranged at the side thereof. In order to solve such a problem, a coaxial shield wiring structure has been proposed. FIG. 33 is a sectional view showing a coaxial shield wiring structure disclosed in Japanese Patent Application Laid-Open No. 6-216343 (1994). In the coaxial shield wiring structure, grounding conductors 211, 212, 213 and 214 are provided through an insulating film 215 vertically and horizontally with respect to a transmission line 210.

In the coaxial shield wiring structure, however, the grounding conductors 213 and 214 are provided on the left and right of the transmission line 210. In addition, these wirings are formed through transfer using a mask pattern. Therefore, the degree of integration is the same as that of an element formed according to a design rule which is twice as much as a currently used design rule (a design rule means a threshold value of a lithography resolution). Thus, there has been a problem in that microfabrication is inhibited. According to a wiring rule with microfabrication of 0.1 µm or less, furthermore, there has been a problem in that the noise eliminating characteristic is deteriorated between transmission lines arranged at the sides thereof In addition, it is necessary to form a special contact hole in order to electrically connect the grounding conductors 211, 212, 213 and 214 to a semiconductor substrate. Therefore, there has been a problem in that a process for manufacturing a semiconductor device is complicated.

SUMMARY OF THE INVENTION

In order to solve the above-mentioned problems in the conventional art, it is an object of the present invention to provide a high-frequency semiconductor device capable of implementing an enhancement in a noise eliminating characteristic of a wiring compatibly with promotion of microfabrication and simplification of a manufacturing process, and a method of manufacturing the semiconductor device.

A first aspect of the present invention is directed to a high-frequency semiconductor device comprising a semiconductor substrate having a main surface, a first wiring provided over the main surface of the semiconductor substrate, and a conductor layer continuously covering a periphery of the first wiring with a first insulator interposed therebetween in a section crossing a direction of extension of the first wiring.

A second aspect of the present invention is directed to the high-frequency semiconductor device according to the first aspect of the present invention, further comprising a second wiring provided over the main surface of the semiconductor substrate with an insulating film interposed therebetween, the conductor layer continuously covering upper and side surfaces of the second wiring with a second insulator interposed therebetween in a section crossing a direction of extension of the second wiring and being connected to the semiconductor substrate.

A third aspect of the present invention is directed to the high-frequency semiconductor device according to the first aspect of the present invention, wherein an upper surface of the conductor layer is flat.

A fourth aspect of the present invention is directed to the high-frequency semiconductor device according to the first aspect of the present invention, wherein the conductor layer transmits a source potential.

A fifth aspect of the present invention is directed to the high-frequency semiconductor device according to the second aspect of the present invention, wherein the conductor layer continuously covers a periphery of the second wiring in cooperation with the semiconductor substrate with the second insulator and the insulating film interposed therebetween in the section crossing the direction of extension of the second wiring.

A sixth aspect of the present invention is directed to the high-frequency semiconductor device according to the first aspect of the present invention, wherein the first wiring is electrically connected to the semiconductor substrate through a conductor plug filled in a through hole selectively formed in the conductor layer with a side insulating film interposed therebetween in a part taken in the direction of extension of the first wiring.

A seventh aspect of the present invention is directed to the high-frequency semiconductor device according to the second aspect of the present invention, wherein a portion of the second insulator which covers the upper and side surfaces of the second wiring and is provided in contact with the conductor layer is formed of the same material.

An eighth aspect of the present invention is directed to the high-frequency semiconductor device according to the first aspect of the present invention, wherein a portion of the first insulator which covers upper and side surfaces of the first wiring and is provided in contact with the conductor layer is formed of the same material.

A ninth aspect of the present invention is directed to a method of manufacturing a high-frequency semiconductor device comprising the steps of (A) preparing a semiconductor substrate having a main surface, (B) depositing a first conductor layer to cover the main surface of the semiconductor substrate, (C) flattening an upper surface of the first conductor layer, (D) forming a first insulating film on the upper surface of the first conductor layer thus flattened, (E) depositing a first conductive film on the first insulating film, (F) forming a second insulating film on the first conductive film, (G) patterning the first conductive film and the second insulating film, thereby forming a first wiring and a first upper insulating film covering an upper surface thereof, (H) depositing a third insulating film to cover the upper surface of the first conductor layer in such a thickness as to bury the first upper insulating film therein, (I) removing the third insulating film to leave, as a first side wall, a portion covering side surfaces of the first wiring and the first upper insulating film, (J) removing the first insulating film to leave portions covered with the first wiring and the first side wall, simultaneously with the step (I) or after the step (I), (K) depositing a second conductor layer to cover the upper surface of the first conductor layer in such a thickness as to bury the first upper insulating film therein, and (L) flattening an upper surface of the second conductor layer to maintain such a configuration that the first upper insulating film is buried.

A tenth aspect of the present invention is directed to a method of manufacturing a high-frequency semiconductor device comprising the steps of (A) preparing a semiconductor substrate having a main surface, (B) depositing a first conductor layer to cover the main surface of the semiconductor substrate, (C) flattening an upper surface of the first conductor layer, (D) forming a first insulating film on the upper surface of the first conductor layer thus flattened, (E) depositing a first sacrificial layer on the first insulating film, (F) selectively forming, in the first sacrificial layer, a trench penetrating from an upper surface to a lower surface thereof, (G) depositing a conductive material to fill in the trench, (H) flattening the upper surface of the first sacrificial layer and an upper surface of the conductive material, thereby forming a first wiring of the conductive material, (I) forming a second insulating film on the upper surface of the first sacrificial layer and an upper surface of the first wiring, (J) removing the second insulating film to leave, as a first upper insulating film, a portion provided on the first wiring, (K) removing the first sacrificial layer, (L) depositing a third insulating film to cover the upper surface of the first conductor layer in such a thickness as to bury the first upper insulating film therein, (M) removing the third insulating film to leave, as a first side wall, a portion covering side surfaces of the first wiring and the first upper insulating film, (N) removing the first insulating film to leave portions covered with the first wiring and the first side wall, simultaneously with the step (M) or after the step (M), (O) depositing a second conductor layer to cover the upper surface of the first conductor layer in such a thickness as to bury the first upper insulating film therein, and (P) flattening an upper surface of the second conductor layer to maintain such a configuration that the first upper insulating film is buried.

An eleventh aspect of the present invention is directed to the method of manufacturing a high-frequency semiconductor device according to the ninth aspect of the present invention, wherein the step (B) includes the steps of (B1) forming a fourth insulating film on the main surface, (B2) forming a second conductive film on the fourth insulating film, (B3) forming a fifth insulating film on the second conductive film, (B4) patterning the second conductive film and the fifth insulating film, thereby forming a second wiring and a second upper insulating film covering an upper surface thereof, (B5) depositing a sixth insulating film to cover the main surface of the semiconductor substrate in such a thickness as to bury the second upper insulating film therein, (B6) removing the sixth insulating film to leave, as a second side wall, a portion covering side surfaces of the second wiring and the second upper insulating film, (B7) removing the fourth insulating film to leave portions covered with the second wiring and the second side wall, simultaneously with the step (B6) or after the step (B6), and (B8) depositing the first conductor layer to cover the main surface of the semiconductor substrate in such a thickness as to bury the second upper insulating film therein, and the step (C) includes the step of (C1) flattening the upper surface of the first conductor layer to maintain such a configuration that the second upper insulating film is buried.

A twelfth aspect of the present invention is directed to the method of manufacturing a high-frequency semiconductor device according to the tenth aspect of the present invention, wherein the step (B) includes the steps of (B1) forming a fourth insulating film on the main surface, (B2) forming a second conductive film on the fourth insulating film, (B3) forming a fifth insulating film on the second conductive film, (B4) patterning the second conductive film and the fifth insulating film, thereby forming a second wiring and a second upper insulating film covering an upper surface thereof, (B5) depositing a sixth insulating film to cover the main surface of the semiconductor substrate in such a thickness as to bury the second upper insulating film therein, (B6) removing the sixth insulating film to leave, as a second side wall, a portion covering side surfaces of the second wiring and the second upper insulating film, (B7) removing the fourth insulating film to leave portions covered with the second wiring and the second side wall, simultaneously with the step (B6) or after the step (B6), and (B8) depositing the first conductor layer to cover the main surface of the semiconductor substrate in such a thickness as to bury the second upper insulating film therein, and the step (C) includes the step of (C1) flattening the upper surface of the first conductor layer to maintain such a configuration that the second upper insulating film is buried.

A thirteenth aspect of the present invention is directed to the method of manufacturing a high-frequency semiconductor device according to the ninth aspect of the present invention, further comprising the steps of (AA) selectively forming, in the first insulating film and the first conductor layer, a through hole penetrating from an upper surface of the first insulating film to a lower surface of the first conductor layer, after the step (D) and before the step (E), (BB) forming a side insulating film covering a side wall surface of the through hole before the step (E), and (CC) forming a conductive plug to fill in the through hole with the side insulating film interposed therebetween before the step (E), the first conductive film being also deposited on the through hole to be connected to the conductive plug at the step (E), and the first wiring being formed to be connected to the conductive plug by covering the through hole at the step (G).

A fourteenth aspect of the present invention is directed to the method of manufacturing a high-frequency semiconductor device according to the twelfth aspect of the present invention, further comprising the steps of (AA) depositing a second sacrificial layer to cover the main surface of the semiconductor substrate in such a thickness as to bury the second upper insulating film therein, after the step (B7) and before the step (B8), and (BB) patterning the second sacrificial layer to leave a part thereof as a columnar portion before the step (BB), the first conductor layer being deposited to cover the main surface of the semiconductor substrate in such a thickness as to bury the second upper insulating film therein at the step (B8), and an upper surface of the columnar portion and the upper surface of the first conductor layer being flattened to maintain such a configuration that the second upper insulating film is buried at the step (C1), and the method further comprising the steps of (CC) removing the columnar portion, thereby forming a through hole in the first conductor layer after the step (C1) and before the step (D), (DD) forming a side insulating film to cover a side wall surface of the through hole after the step (CC) and before the step (D), and (EE) forming a conductive plug to fill in the through hole with the side insulating film interposed therebetween before the step (D), the step (D) including the steps of (D1) forming the first insulating film on the upper surface of the first conductor layer which is flattened and over the through hole, and (D2) selectively removing the first insulating film such that at least a part of an upper surface of the conductive plug is exposed, the first sacrificial layer being deposited on an exposed surface of the conductive plug as well as the first insulating film at the step (E), the trench being formed such that the exposed surface of the conductive plug is exposed at the step (F), and the conductive material being deposited to be connected to the exposed surface of the conductive plug at the step (G).

A fifteenth aspect of the present invention is directed to the method of manufacturing a high-frequency semiconductor device according to the fourteenth aspect of the present invention, wherein at least an upper surface portion of the fifth insulating film and the sixth insulating film are formed of the same material and the second sacrificial layer is formed of another material different therefrom.

A sixteenth aspect of the present invention is directed to the method of manufacturing a high-frequency semiconductor device according to the tenth aspect of the present invention, wherein at least an upper surface portion of the second insulating film and the third insulating film are formed of the same material.

According to the first aspect of the present invention, the periphery of the first wiring is continuously covered by the conductor layer with the insulator interposed therebetween in the section crossing the direction of extension thereof. By using the conductor layer as a power line (including a grounding conductor), therefore, it is possible to more reduce a noise entering the first wiring and a noise emitted from the first wiring than that in a conventional device. Moreover, the conductor layer can be formed to bury the first wiring therein. Accordingly, microfabrication of an element is not prevented. Furthermore, it is not necessary to form a contact hole in order to implement electrical connection of the conductor layer to the semiconductor substrate. Consequently, a manufacturing process can be simplified. Thus, it is possible to achieve an enhancement in a noise eliminating characteristic of the wiring compatibly with promotion of the microfabrication and the simplification of the manufacturing process.

According to the second aspect of the present invention, the upper and side surfaces of the second wiring are continuously covered by the conductor layer with the insulator interposed therebetween in the section crossing the direction of extension thereof, and the conductor layer is connected to the semiconductor substrate. By using the conductor layer as a power line (including a grounding conductor), therefore, it is possible to more reduce a noise entering the second wiring, a noise emitted from the second wiring and a noise influencing between the first wiring and the second wiring than that in a conventional device.

According to the third aspect of the present invention, the upper surface of the conductor layer is flat. Therefore, it is easy to further provide an upper wiring over the conductor layer by using the present device as an intermediate product in a semiconductor process.

According to the fourth aspect of the present invention, the conductor layer is formed as a power line (including a grounding conductor). Therefore, it is possible to more reduce a noise entering the first and second wirings, a noise emitted from the first and second wirings and a noise influencing the first wiring and the second wiring than that in a conventional device.

According to the fifth aspect of the present invention, the conductor layer continuously covers the periphery of the second wiring in cooperation with the semiconductor substrate with the second insulator and the insulating film interposed therebetween in the section crossing the direction of extension of the second wiring. Therefore, the noise eliminating characteristic for the second wiring can further be enhanced.

According to the sixth aspect of the present invention, the through hole and the conductive plug are provided in the conductor layer. Therefore, the first wiring positioned on an upper layer can be connected to the semiconductor substrate without a difficulty in a manufacturing process in the same manner as in a conventional well-known semiconductor device.

According to the seventh aspect of the present invention, the portion of the second insulator which covers the upper and side surfaces of the second wiring and is provided in contact with the conductor layer is formed of the same material. Therefore, in the case in which the conductor layer is to be formed by using a damascene process, a contact hole for connecting the upper wiring to the semiconductor substrate can easily be formed in the conductor layer.

According to the eighth aspect of the present invention, the portion of the first insulator which covers the upper and side surfaces of the first wiring and is provided in contact with the conductor layer is formed of the same material. Therefore, in the case in which the conductor layer is to be formed by using the damascene process, a contact hole for connecting the first wiring to the upper wiring can easily be formed in the conductor layer.

According to the ninth aspect of the present invention, the semiconductor device according to the first aspect of the present invention can easily be manufactured by a combination of a conventional well-known semiconductor process, for example, film formation, patterning and the like.

According to the tenth aspect of the present invention, the semiconductor device according to the first aspect of the present invention can easily be manufactured by a combination of a conventional well-known semiconductor process, for example, film formation, patterning and the like, particularly, by employing the damascene process. Accordingly, the method is suitable for using a metal containing copper as a main component for a material of the conductor layer.

According to the eleventh aspect of the present invention, the semiconductor device according to the second aspect of the present invention can easily be manufactured by a combination of a conventional well-known semiconductor process, for example, film formation, patterning and the like.

According to the twelfth aspect of the present invention, the semiconductor device according to the second aspect of the present invention can easily be manufactured by a combination of a conventional well-known semiconductor process, for example, film formation, patterning and the like, particularly, by employing the damascene process.

According to the thirteenth aspect of the present invention, the semiconductor device according to the sixth aspect of the present invention can easily be manufactured by a combination of a conventional well-known semiconductor process, for example, film formation, patterning and the like.

According to the fourteenth aspect of the present invention, the semiconductor device according to the sixth aspect of the present invention can easily be manufactured by a combination of a conventional well-known semiconductor process, for example, film formation, patterning and the like, particularly, by employing the damascene process.

According to the fifteenth aspect of the present invention, at least the upper surface portion of the fifth insulating film and the sixth insulating film are formed of the same material and the second sacrificial layer is formed of another material different therefrom. Therefore, in the case in which the first conductor layer is to be formed by using the damascene process, a contact hole for connecting the upper wiring to the semiconductor substrate can easily be formed in the first conductor layer.

According to the sixteenth aspect of the present invention, at least the upper surface portion of the second insulating film and the third insulating film are formed of the same material. Therefore, in the case in which the first conductor layer is to be formed by using the damascene process, a contact hole for connecting the first wiring to the upper wiring can easily be formed in the second conductor layer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a front sectional view showing a semiconductor device according to a second embodiment, FIG. 27 is a view showing a process for manufacturing a semiconductor device according to a variant of the second embodiment, FIGS. 28 to 30 are views showing a process for manufacturing the device illustrated in FIG. 27, and FIGS. 31 to 33 are front sectional views showing a wiring structure to be used in a conventional semiconductor device.

DESCRIPTION OF THE PREFERRED EMBODIMENTS

First Embodiment (Structure of Device)

Figure 1:
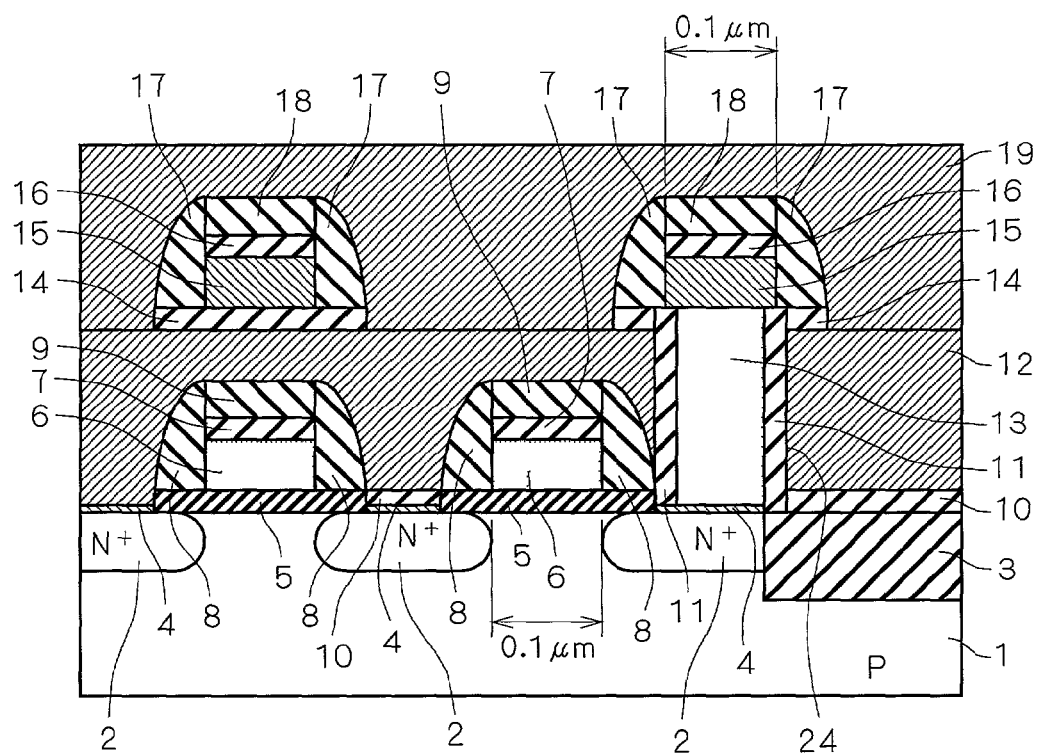
FIG. 1 is a front sectional view showing a semiconductor device according to a first embodiment.

FIG. 1 is a front sectional view showing a semiconductor device according to a first embodiment of the present invention. This semiconductor device 101 has a semiconductor substrate 1 and a wiring structure formed thereover.

The semiconductor substrate 1 is a silicon substrate having a main surface in which an insulating film 3 to be a trench isolation structure (STI: Shallow Trench Isolation) and an impurity introduced layer 2 are selectively formed. In the wiring structure, a plurality of wirings 6 to be lower wirings for signal transmission and a plurality of wirings 15 to be upper wirings for signal transmission are formed over the semiconductor substrate 1. Both of the wirings 6 and 15 are constituted to transmit a high-frequency electric signal of 1 GHz or more.

The wiring 6 is opposed to the main surface of the semiconductor substrate 1 with an insulating film 5 interposed therebetween. Upper insulating films 7 and 9 are formed on the wiring 6. Moreover, a side wall 8 to be an insulator is formed on side surfaces of the wiring 6 and the upper insulating films 7 and 9. In other words, the wiring 6 is surrounded by the insulator in a section perpendicular to a direction of extension thereof. The wiring 6 and the insulator covering a periphery thereof are buried in a conductor layer 12 formed to cover the semiconductor substrate 1. In a section perpendicular to the direction of extension of the wiring 6, accordingly, upper and side surfaces of the wiring 6 are continuously covered by the conductor layer 12 with the insulator interposed therebetween. A material of the conductor layer 12 is a metal containing aluminum as a main component (including the aluminum itself).

The conductor layer 12 has an upper surface flattened and a lower surface partially connected electrically to the impurity introduced layer 2 formed in the main surface of the semiconductor substrate 1. A silicide film (semiconductor metal compound film) 4 is formed on a portion in the main surface of the semiconductor substrate 1 which is to be electrically connected to the conductor layer 12. Moreover, an insulating film 10 is formed in a portion where the conductor layer 12 and the semiconductor substrate 1 are to be electrically insulated from each other.

The wiring 15 is provided opposite to the upper surface of the conductor layer 12 with an insulating film 14 interposed therebetween. Upper insulating films 16 and 18 are formed on the wiring 15. Moreover, a side wall 17 to be an insulator is formed on side surfaces of the wiring 15 and the upper insulating films 16 and 18. In other words, the wiring 15 is surrounded by the insulator in a section perpendicular to a direction of extension thereof. A conductor layer 19 is formed to bury the wiring 15 and the insulator covering a periphery of the wiring 15 therein and to cover the upper surface of the conductor layer 12. A material of the conductor layer 19 is a metal containing aluminum as a main component similarly to the conductor layer 12.

The conductor layer 19 has an upper surface flattened and a lower surface connected integrally with the upper surface of the conductor layer 12. In a section perpendicular to the direction of extension of the wiring 15, accordingly, the periphery of the wiring 15 is continuously covered by the conductor layers 12 and 19 with an insulator interposed therebetween. The conductor layers 12 and 19 are connected to one of power lines of the semiconductor device 101. More specifically, a pair of power input terminals (not shown) are formed in the semiconductor device 101 and the conductor layers 12 and 19 are connected to one of the power input terminals. Preferably, the conductor layers 12 and 19 are grounding conductors for transmitting a grounding potential.

The conductor layer 12 is provided with a contact hole 24 under a part in the direction of extension of the conductor 15. The inside of the contact hole 24 is provided with a side insulating film 11 covering a side wall surface thereof and a conductive plug 13 filled in the contact hole 24 with the side insulating film 11 interposed therebetween. The conductive plug 13 is connected to a lower surface of the conductor 15, and furthermore, is electrically connected through a silicide film 4 to the impurity introduced layer 2 provided in the main surface of the semiconductor substrate 1. In other words, the conductor 15 is electrically connected to the semiconductor substrate 1 through the conductive plug 13.

Referring to each element, an example of a material and a dimension will be listed below. All values of the dimension are rough estimations. The semiconductor substrate 1 is a P-type silicon substrate. The impurity introduced layer 2 is an $N^+$ diffusion layer. The insulating film 3 is a TEOS (tetraethyl orthosilicate) film or an HTO (high temperature oxide; high temperature thermal CVD oxide) film which has a thickness of 300 nm. A material of the silicide film 4 is CoSi or TiSi. The insulating film 5 is a thermal oxide film ($SiO_2$) or a thermal nitride oxide film (SiON) which has a thickness of 3 nm. The wiring 6 is a polysilicon film having a width of 100 nm and a thickness of 200 nm. The upper insulating film 7 is a TEOS film having a thickness of 100 nm.

The side wall 8 is a nitride film ($Si_3N_4$) having a thickness of 50 nm and the upper insulating film 9 is a nitride film ($Si_3N_4$) having a thickness of 100 nm. The insulating film 10 and the side insulating film 11 are TEOS films. The conductor layer 12 has a thickness of 500 nm. A material of the conductive plug 13 is polysilicon. The insulating film 14 is a TEOS film having a thickness of 100 nm. The wiring 15 is a metal film containing, as a main component, aluminum having a width of 100 nm and a thickness of 200 nm. The upper insulating film 16 is a TEOS film having a thickness of 100 nm. The side wall 17 is a nitride film ($Si_3N_4$) having a thickness of 50 nm. The upper insulating film 18 is a nitride film ($Si_3N_4$) having a thickness of 100 nm. The conductor layer 19 has a thickness of 500 nm.

(Manufacturing Method)

Figure 2:
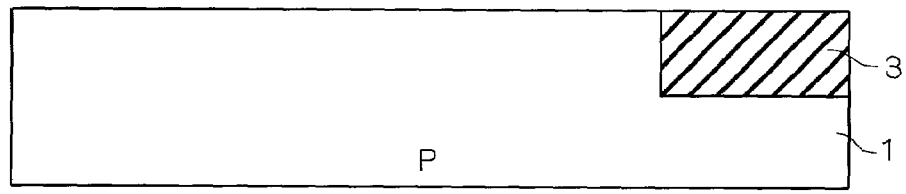
FIGS. 2 to 13 are views showing a process for manufacturing the device illustrated in FIG. 1.

FIGS. 2 to 13 are views showing a manufacturing process, illustrating a preferred method of manufacturing the semiconductor device 101. In the following description, all numeric values related to manufacturing conditions are rough estimations. In order to manufacture the semiconductor device 101, first of all, a step shown in FIG. 2 is executed. At the step shown in FIG. 2, the semiconductor substrate 1 being a P-type silicon substrate is first prepared. By using selective etching, next, a trench having a depth of 300 nm is selectively formed in the main surface of the semiconductor substrate 1 in accordance with a pattern of an isolation region (an isolation pattern). Subsequently, an oxide film such as a TEOS film or an HTO film is buried as the insulating film 3 in the trench. Consequently, the isolation region having a trench isolation structure (STI) is formed. Then, well implantation, isolation implantation and channel implantation are carried out on the main surface of the semiconductor substrate 1, and furthermore, a heat treatment for activation of an implanted impurity or the like is performed (not shown). Since the well implantation, the isolation implantation and the channel implantation are carried out in a conventional well-known process, detailed description thereof will be omitted.

Figure 3:
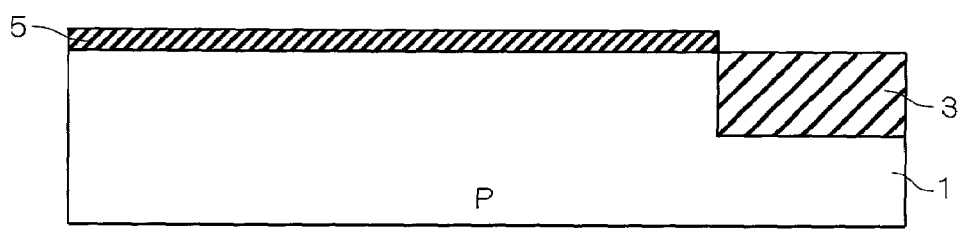

At a step shown in FIG. 3, next, oxidation is carried out so that an oxide film ($SiO_2$) having a thickness of 3 nm is formed as the insulating film 5 on the main surface of the semiconductor substrate 1.

Figure 4:
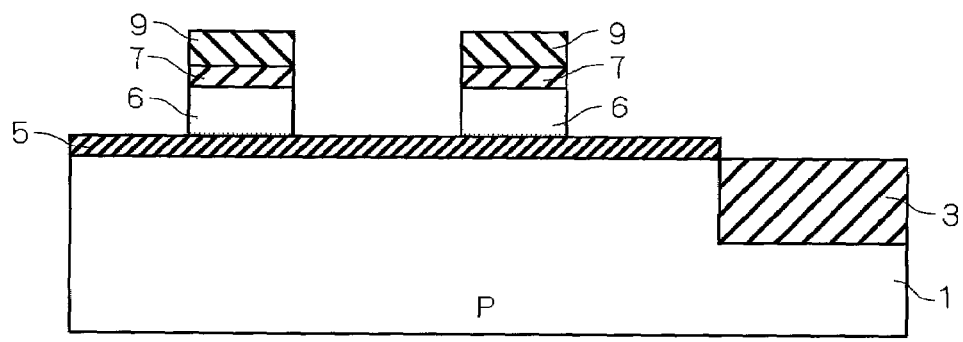

At a step shown in FIG. 4, subsequently, a polysilicon film having a thickness of 200 nm, a TEOS film having a thickness of 100 nm and a nitride film ($Si_3N_4$) having a thickness of 100 nm are first deposited sequentially on the insulating film 5. Then, the selective etching using a gate mask is carried out. Consequently, a three-layered structure including the wiring 6 and the upper insulating films 7 and 9 is formed.

Figure 5:
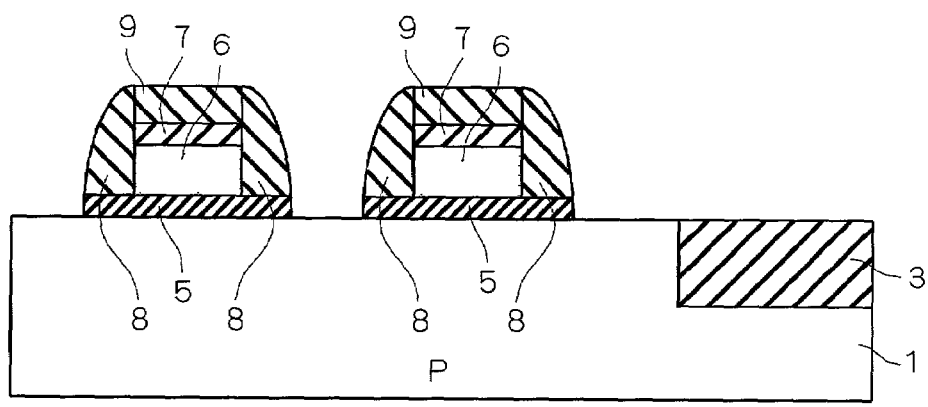

At a step shown in FIG. 5, a nitride film ($Si_3N_4$) is first deposited to cover the semiconductor substrate 1. The nitride film is deposited such that the three-layered structure is buried therein. Then, the nitride film thus deposited is etched back so that the side wall 8 covering a side surface of the three-layered structure is formed. During this process, a portion of the insulating film 5 which is not covered with the three-layered structure and the side wall 8 is also removed simultaneously.

Figure 6:
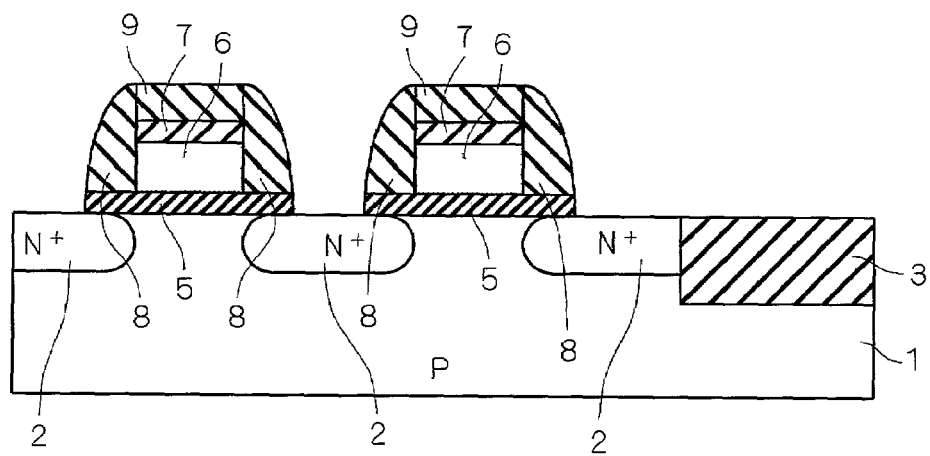

At a step shown in FIG. 6, an N-type impurity ion is first implanted by using the three-layered structure including the side wall 8 as a shield. Consequently, the impurity introduced layer 2 is formed in the exposed main surface of the semiconductor substrate 1. The introduced N-type impurity is activated through a subsequent heat treatment. The heat treatment is carried out at a temperature of 850° C. for 30 minutes by using a furnace or at a temperature of 1000° C. for 30 seconds by using an RAT (ramp annealing device).

Figure 7:
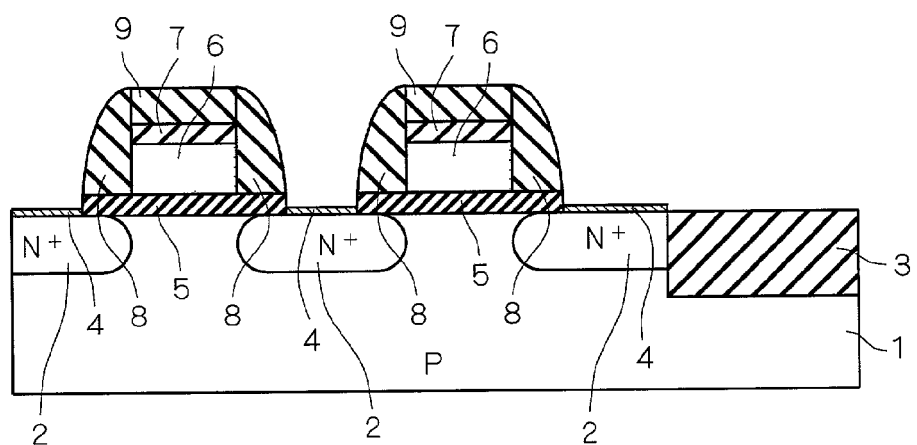

At a step shown in FIG. 7, subsequently, cobalt (Co) is deposited on the exposed main surface of the semiconductor substrate 1 and a heat treatment is carried out at a temperature of 600° C. by using the RAT. As a result, CoSi is formed as the silicide film 4 on a surface of the impurity introduced layer 2.

Figure 8:
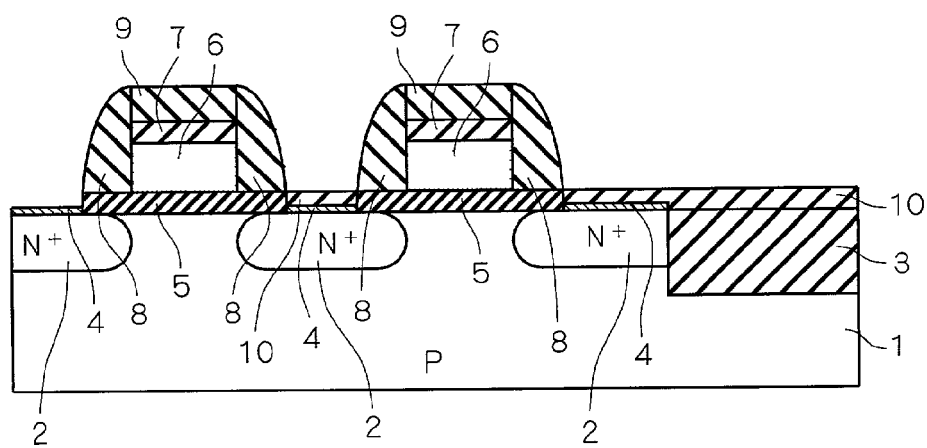

At a step shown in FIG. 8, a TEOS film is deposited to cover the main surface of the semiconductor substrate 1 and is then etched selectively by using a mask. Consequently, a portion in the main surface of the semiconductor substrate 1 to which the conductor layer 12 to be formed at a subsequent step is not connected is covered with the insulating film 10.

Figure 9:
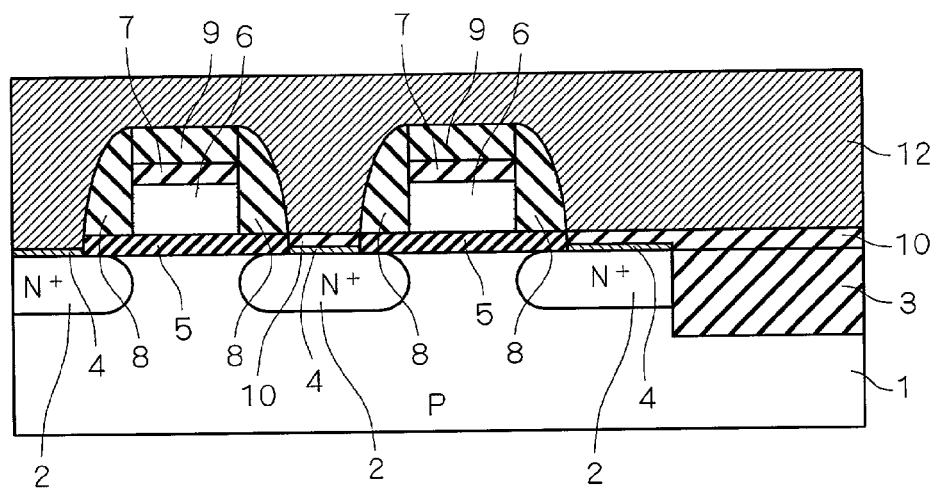

At a step shown in FIG. 9, first of all, aluminum is deposited to cover the main surface of the semiconductor substrate 1. Then, an upper surface of an aluminum layer is flattened by using CMP (chemical mechanical polishing). Consequently, the conductor layer 12 having a thickness of 500 nm is formed. The CMP is carried out such that the upper insulating film 9 is not exposed from the conductor layer 12.

Figure 10:
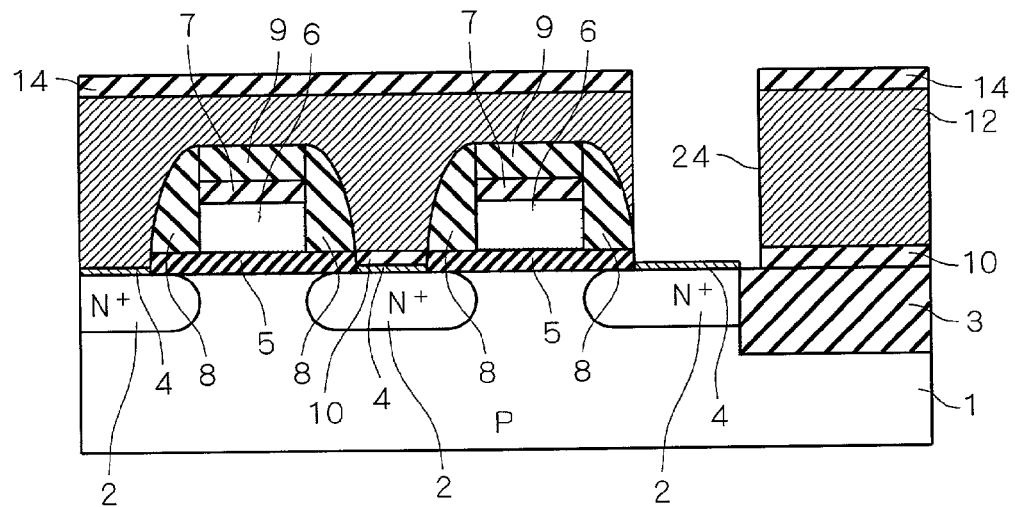

At a step shown in FIG. 10, first of all, a TEOS film having a thickness of 100 nm is deposited as the insulating film 14 on an upper surface of the conductor layer 12. Then, selective etching using a contact mask is executed. Consequently, the contact hole 24 reaching the silicide film 4 from an upper surface of the insulating film 14 through the conductor layer 12 and the insulating film 10 is selectively formed in the insulating film 14, the conductor layer 12 and the insulating film 10. The contact hole 24 is formed just over a part of the impurity introduced layer 2.

Figure 11:
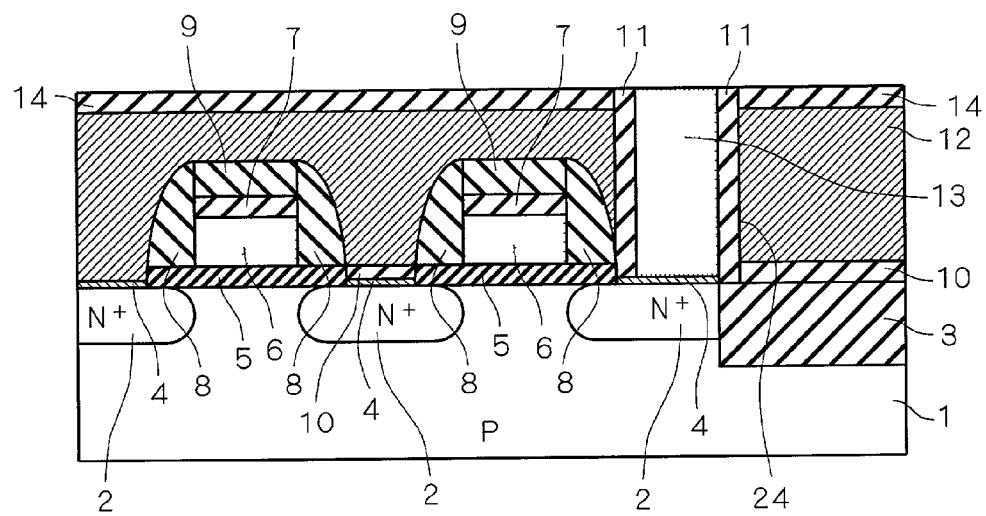

At a step shown in FIG. 11, first of all, a TEOS film having a thickness of 20 nm is deposited on the inside of the contact hole 24 and the insulating film 14. Then, etch back is carried out so that the side insulating film 11 covering a side wall surface of the contact hole 24 is formed. Subsequently, polysilicon is deposited to fill in the inside of the side insulating film 11 and to cover the insulating film 14. Then, the CMP is executed until the insulating film 14 is exposed so that the polysilicon provided on the insulating film 14 is removed and an upper surface of the polysilicon filled in the contact hole 24 with the side insulating film 11 interposed therebetween is flattened together with an upper surface of the insulating film 14. The polysilicon filled in the contact hole 24 acts as the conductive plug 13.

Figure 12:
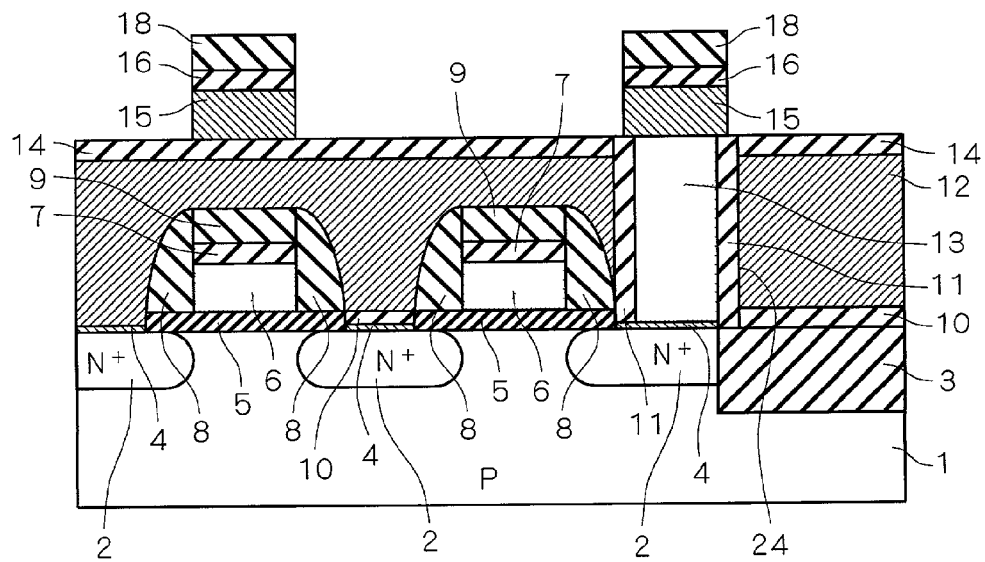

At a step shown in FIG. 12, first of all, an aluminum film having a thickness of 200 nm, a TEOS film having a thickness of 50 nm and a nitride film ($Si_3N_4$) having a thickness of 100 nm are sequentially deposited on the insulating film 14 and the conductive plug 13. Then, the selective etching using a mask is carried out. Consequently, a three-layered structure including the wiring 15 and the upper insulating films 16 and 18 is formed.

Figure 13:
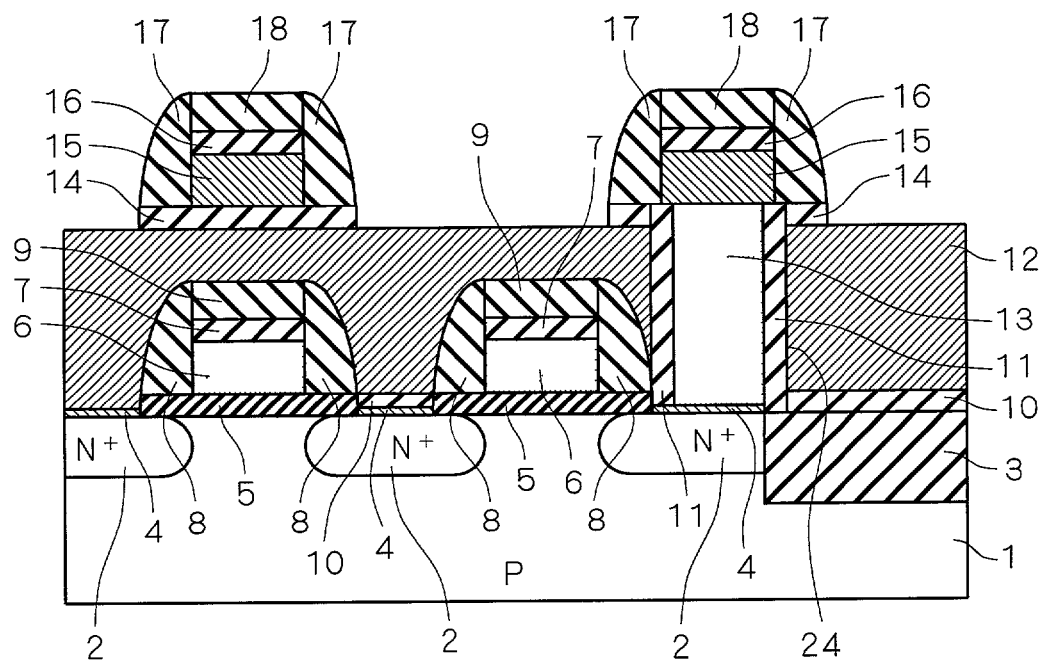

At a step shown in FIG. 13, a nitride film ($Si_3N_4$) is first deposited to cover the upper surface of the conductor layer 12. The nitride film is deposited such that the three-layered structure is buried therein. Then, the nitride film thus deposited is etched back so that the side wall 17 covering a side surface of the three-layered structure is formed. During this process, a portion of the insulating film 14 which is not covered with the three-layered structure and the side wall 17 is also removed simultaneously. As a result, the upper surface of the conductor layer 12 is selectively exposed.

Returning to FIG. 1, subsequently, aluminum is first deposited to cover the upper surface of the conductor layer 12. Then, an upper surface of an aluminum layer is flattened by using the CMP (chemical mechanical polishing). Consequently, the conductor layer 19 having a thickness of 500 nm is formed. The CMP is carried out such that the upper insulating film 18 is not exposed from the conductor layer 19. Through the above-mentioned steps, the semiconductor device 101 shown in FIG. 1 is completed.

The material and dimension of each element described above are illustrative and it is a matter of course that other materials and dimensions can also be used. For example, generally, a semiconductor substrate other than the silicon substrate can also be used for the semiconductor substrate 1.

(Advantage of First Embodiment)

Figure 31:
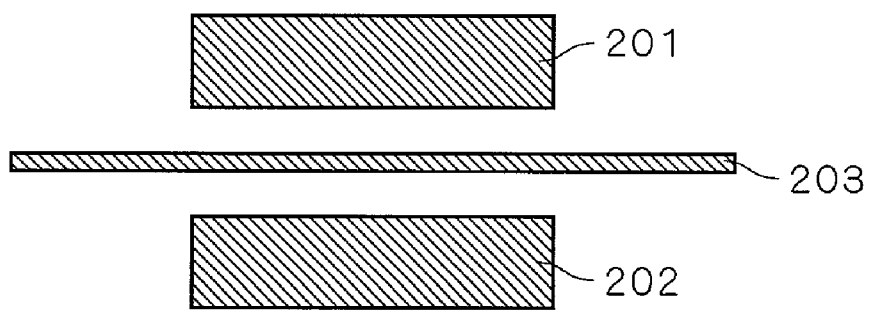
Figure 32:
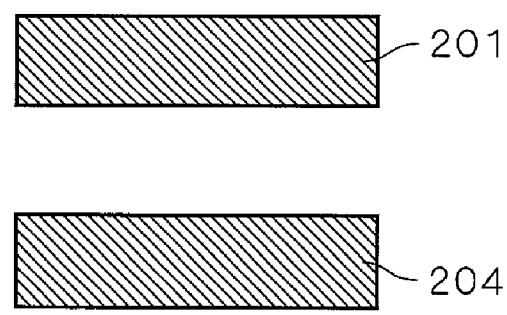

As described above, in the semiconductor device 101, the periphery of the wiring 15 to be a signal transmission wiring is continuously covered by the conductor layers 12 and 19 with the insulator interposed therebetween in the section crossing the direction of extension thereof. Consequently, a noise eliminating characteristic between the wiring 15 and another wiring (for example, the wiring 15 adjacently provided at the side thereof or the wiring 6 adjacently provided thereunder) can be more enhanced than that in any of the wiring structures shown in FIGS. 31 to 33.

Moreover, the upper and side surfaces of the wiring 6 to be the signal transmission wiring are continuously covered by the conductor layer 12 with the insulator interposed therebetween in the section crossing the direction of extension thereof, and the conductor layer 12 is connected to the semiconductor substrate 1. Consequently, the noise eliminating characteristic between the wiring 6 and another wiring (for example, the wiring 6 adjacently provided at the side thereof or the wiring 15 adjacently provided thereabove) can be more enhanced than that in any of the wiring structures shown in FIGS. 31 to 33.

Furthermore, the conductor layers 12 and 19 are formed such that the wirings 6 and 15 are buried therein, and the same patterning as that of each of the wirings 6 and 15 is not required. Differently from the coaxial shield wiring structure shown in FIG. 33 which requires the patterning, therefore, microfabrication of the element fabricated in the semiconductor device 101 is not inhibited. Furthermore, it is not necessary to form a contact hole in order to implement electrical connection of the conductor layers 12 and 19 and the semiconductor substrate 1. Consequently, the manufacturing process can be simplified. Thus, the semiconductor device 101 and the method of manufacturing the semiconductor device 101 can implement an enhancement in the noise eliminating characteristic of the wiring compatibly with promotion of the microfabrication and simplification of the manufacturing process.

According to the method of manufacturing the semiconductor device 101 described above, moreover, the upper surface of the conductor layer 12 is formed flatly. Therefore, the upper wiring 15 can easily be formed on the conductor layer 12. Furthermore, the upper surface of the conductor layer 19 is flat. Therefore, it is easy to provide a wiring to be a third layer (not shown) over the conductor layer 19. Also in the finished semiconductor device 101, furthermore, the wirings 6 and 15 are not only surrounded by the conductor layers 12 and 19 but also buried in the conductor layers 12 and 19 having the upper surfaces flattened. Consequently, the noise eliminating characteristics of the wirings 6 and 15 can further be enhanced.

Second Embodiment (Structure of Device)

FIG. 14 is a front sectional view showing a semiconductor device according to a second embodiment of the present invention. This semiconductor device 102 is characteristically different from the semiconductor device 101 (FIG. 1) according to the first embodiment in that conductor layers 62 and 69 covering a plurality of wirings 6 acting as lower wirings and a plurality of wirings 65 acting as upper wirings are formed of a metal containing copper as a main component (including the copper itself). The wiring 65 is constituted to transmit a high-frequency electric signal of 1 GHz or more similarly to the wiring 15 of the semiconductor device 101.

The wiring 65 is provided opposite to a flat upper surface of the conductor layer 62 with an insulating film 64 interposed therebetween. An upper insulating film 66 is formed on the wiring 65. Moreover, a side wall 67 to be an insulator is formed on side surfaces of the wiring 65 and the upper insulating film 66. In other words, the wiring 65 is surrounded by the insulator in a section perpendicular to a direction of extension thereof. The conductor layer 69 is formed to bury the wiring 65 and the insulator coving a periphery of the wiring 65 therein and to cover an upper surface of the conductor layer 62.

The conductor layer 69 has an upper surface flattened and a lower surface connected integrally with the upper surface of the conductor layer 62. In a section perpendicular to the direction of extension of the wiring 65, accordingly, a periphery of the wiring 65 is continuously covered by the conductor layers 62 and 69 with an insulator interposed therebetween. The conductor layers 62 and 69 are connected to one of power lines of the semiconductor device 102. More specifically, a pair of power input terminals (not shown) are formed in the semiconductor device 102 in the same manner as in the semiconductor device 101, and the conductor layers 62 and 69 are connected to one of the power input terminals, preferably, the terminal to which a grounding potential is to be applied.

The conductor layer 62 is provided with a contact hole 74 under a part in the direction of extension of the conductor 65. The inside of the contact hole 74 is provided with a side insulating film 61 covering a side wall surface thereof and a conductive plug 63 filled in the contact hole 74 with the side insulating film 61 interposed therebetween. The conductive plug 63 is connected to a lower surface of the conductor 65, and furthermore, is electrically connected through a silicide film 4 to an impurity introduced layer 2 provided in a main surface of a semiconductor substrate 1. In other words, the conductor 65 is electrically connected to the semiconductor substrate 1 through the conductive plug 63.

Referring to each element which is not provided in the semiconductor device 101 (FIG. 1), an example of a material and dimension will be listed below. All values of the dimension are rough estimations. An insulating film 60 and the side insulating film 61 substituted for the insulating film 10 and the side wall insulating film 11 in the semiconductor device 101 (FIG. 1) are nitride films ($Si_3N_4$). The conductor layer 62 has a thickness of 500 nm. A material of the conductive plug 63 is a metal containing copper as a main component. The insulating film 64 is a nitride film ($Si_3N_4$). The wiring 65 is a metal film containing, as a main component, copper having a width of 100 nm and a thickness of 200 nm. The upper insulating film 66 is a TEOS film having a thickness of 200 nm. The side wall 67 is a nitride film ($Si_3N_4$) having a thickness of 50 nm. The conductor layer 69 has a thickness of 500 nm.

(Manufacturing Method)

Figure 15:
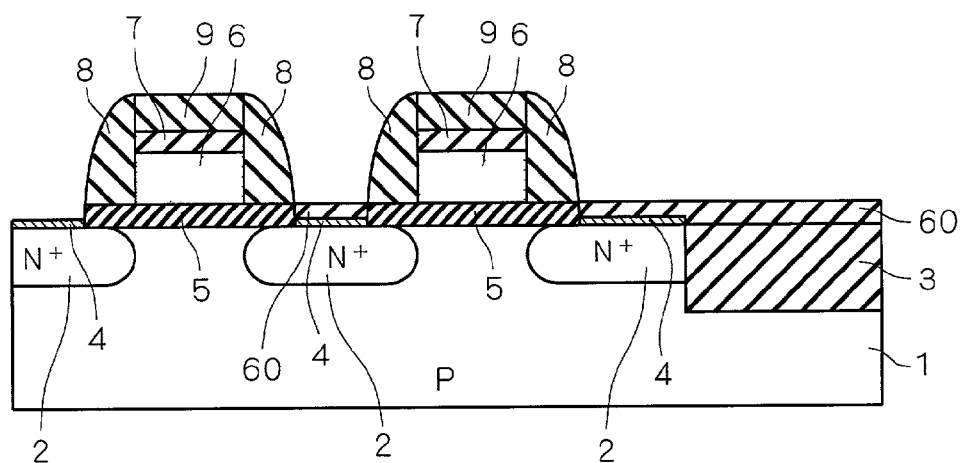
FIGS. 15 to 26 are views showing a process for manufacturing the device illustrated in FIG. 14.

FIGS. 15 to 27 are views showing a manufacturing process, illustrating a preferred method of manufacturing the semiconductor device 102. In the following description, all numeric values related to manufacturing conditions are rough estimations. In order to manufacture the semiconductor device 102, the steps shown in FIGS. 2 to 7 are first executed and the step shown in FIG. 15 is then executed. At the step shown in FIG. 15, a nitride film ($Si_3N_4$) is deposited to cover the main surface of the semiconductor substrate 1, and is then etched selectively by using a mask. Consequently, a portion in the main surface of the semiconductor substrate 1 to which the conductor layer 62 to be formed at a subsequent step is not connected is covered with the insulating film 60.

Figure 16:
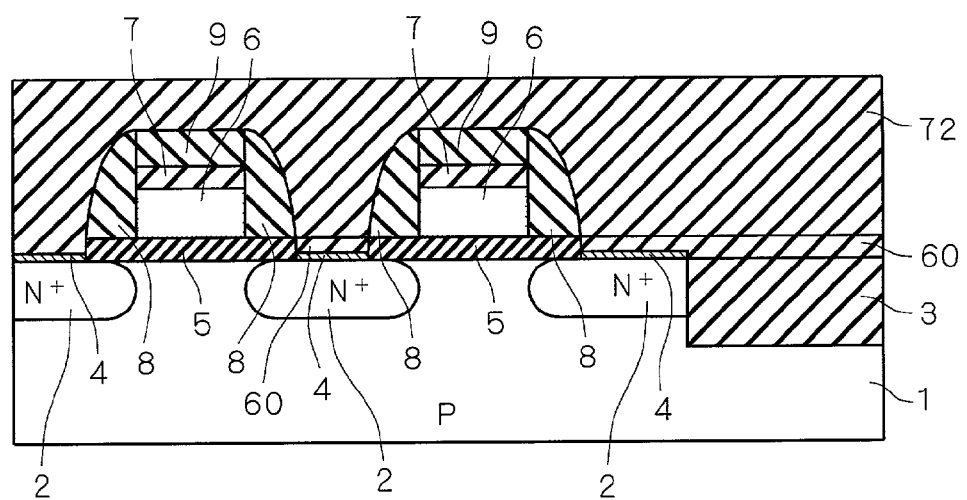

At a step shown in FIG. 16, subsequently, a TEOS layer is first deposited to cover the main surface of the semiconductor substrate 1. Then, an upper surface of the TEOS layer is flattened by using CMP so that a TEOS layer 72 having a thickness of 500 nm is formed as a sacrificial layer (a layer to be formed for utilization as a mold and to be removed at a subsequent step will be provisionally referred to as a sacrificial layer in this specification). The CMP is carried out such that an upper insulating film 9 is not exposed from the TEOS layer 72.

Figure 17:
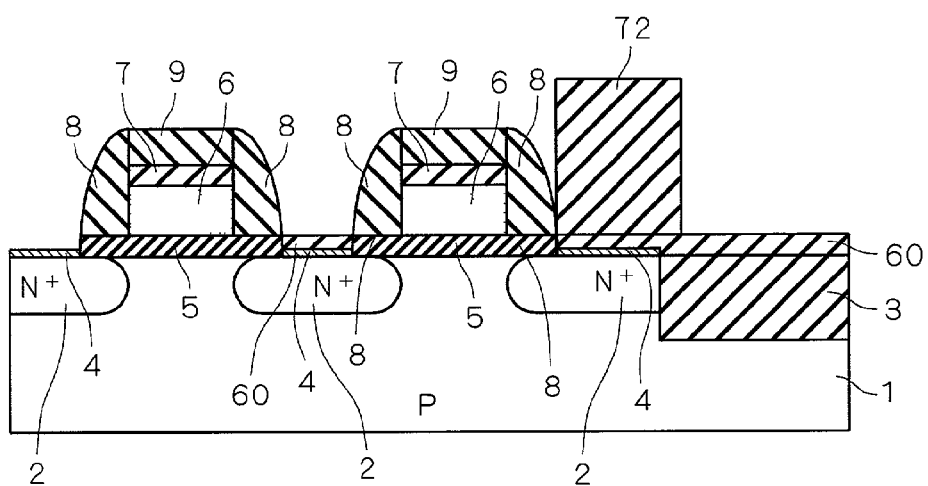

At a step shown in FIG. 17, then, selective etching using a positive mask of a contact hole is carried out so that the TEOS layer 72 is subjected to patterning. As a result, the TEOS layer 72 is removed leaving a columnar portion just over a part of the impurity introduced layer 2.

Figure 18:
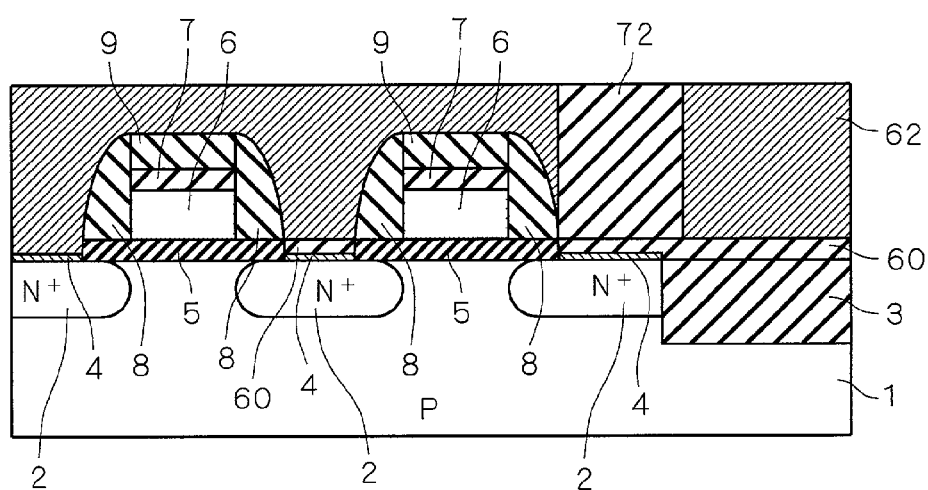

At a step shown in FIG. 18, subsequently, copper is first deposited to cover the main surface of the semiconductor substrate 1 and to bury the upper insulating film 9 therein. Then, an upper surface of a copper layer and an upper surface of the columnar TEOS layer 72 are flattened by using the CMP. Consequently, the conductor layer 62 having a thickness of 500 nm is formed. The CMP is carried out such that the upper insulating film 9 is not exposed from the conductor layer 62.

Figure 19:
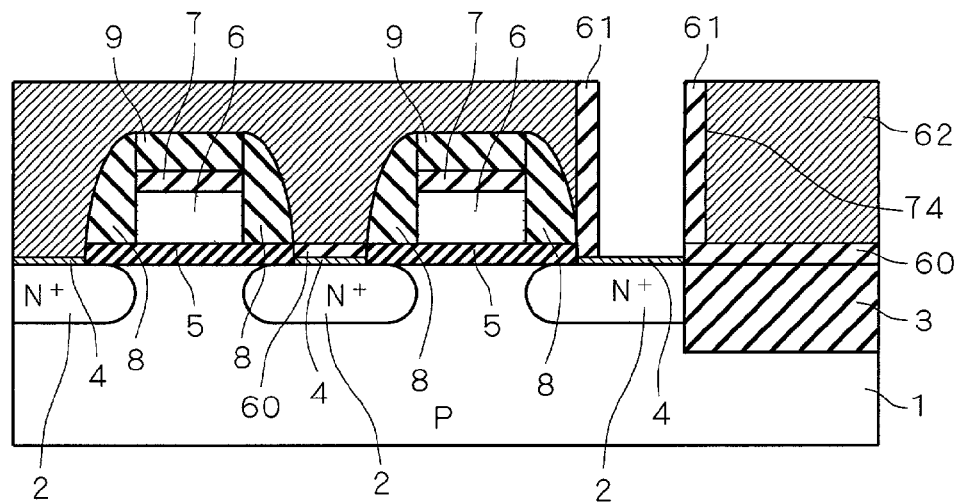

At a step shown in FIG. 19, subsequently, the TEOS layer 72 and the insulating film 60 provided thereunder are first removed so that the contact hole 74 is formed in the conductor layer 62. The contact hole 74 is formed just over a part of the impurity introduced layer 2 so that the silicide film 4 is exposed. Then, a nitride film ($Si_3N_4$) is deposited on the inside of the contact hole 74 and the conductor layer 62. Thereafter, etch back is carried out so that the side insulating film 61 covering a side wall surface of the contact hole 74 is formed.

Figure 20:
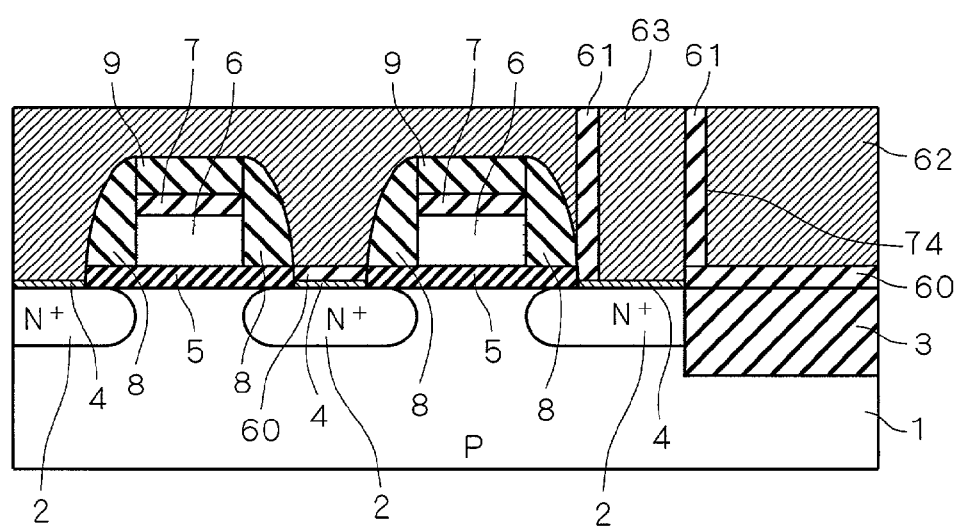

At a step shown in FIG. 20, subsequently, copper is deposited to fill in the inside of the side insulating film 61 and to cover the upper surface of the conductor layer 62. Then, the CMP is executed until the upper surface of the conductor layer 62 and an upper edge of the side insulating film 61 are exposed. Consequently, the upper surface of the conductor layer 62, the upper edge of the side insulating film 61 and an upper surface of a copper layer filled in the contact hole 74 with the side insulating film 61 interposed therebetween are flattened. The copper layer filled in the contact hole 74 acts as the conductive plug 63.

Figure 21:
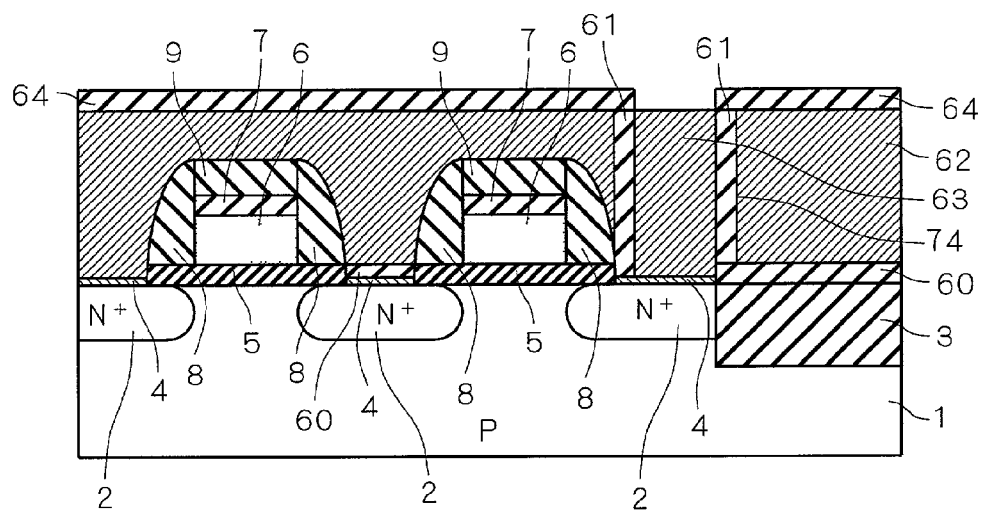

At a step shown in FIG. 21, first of all, the nitride film 64 is deposited on the upper surface of the conductor layer 62, the upper edge of the side insulating film 61 and an upper surface of the conductive plug 63. Then, selective etching is executed by using a contact mask. Consequently, a portion of the nitride film which is provided just over the contact hole 74 is selectively removed. Subsequently, a nitride film is deposited again, and furthermore, is etched back. Thus, an annular side wall portion of the nitride film is opened on the upper surface of the conductive plug 63. The conductive plug 63 is exposed in a portion surrounded by the annular side wall portion.

Figure 22:
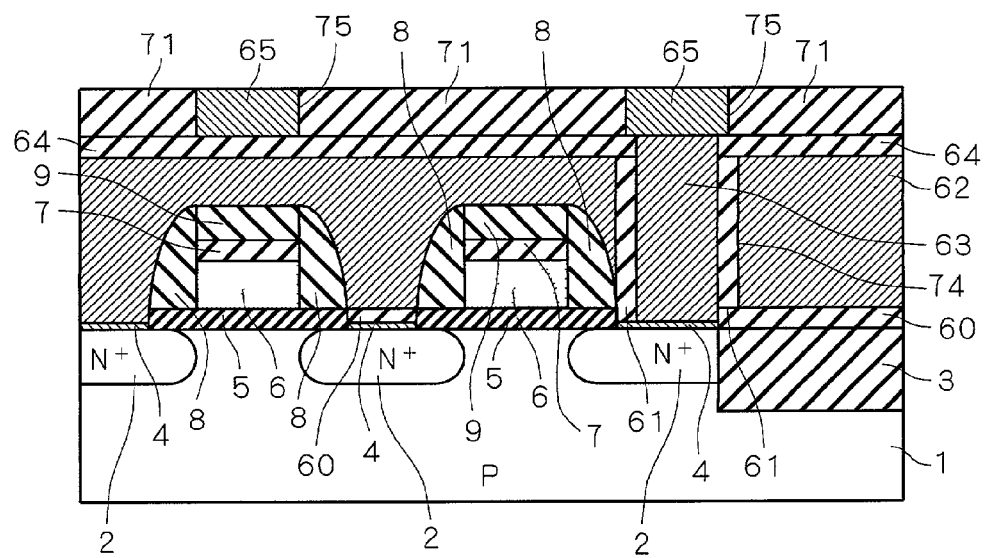

At a step shown in FIG. 22, then, the conductor layer 65 is formed by using a so-called damascene process. In other words, the TEOS layer 71 to be a sacrificial layer is first deposited on the insulating film 64 and the conductive plug 63. Thereafter, selective etching using a mask is carried out so that a trench 75 is formed in a portion of the TEOS layer 71 where the wiring 65 is to be formed. The trench 75 is formed such that the exposed portion of the conductive plug 63 is exposed. Subsequently, copper is deposited to fill in the trench 75 and an upper surface of the deposited copper and an upper surface of the TEOS layer 71 are then flattened by using the CMP. Consequently, the wiring 65 is formed in the trench 75. The wiring 65 is connected integrally with the conductive plug 63.

Figure 23:
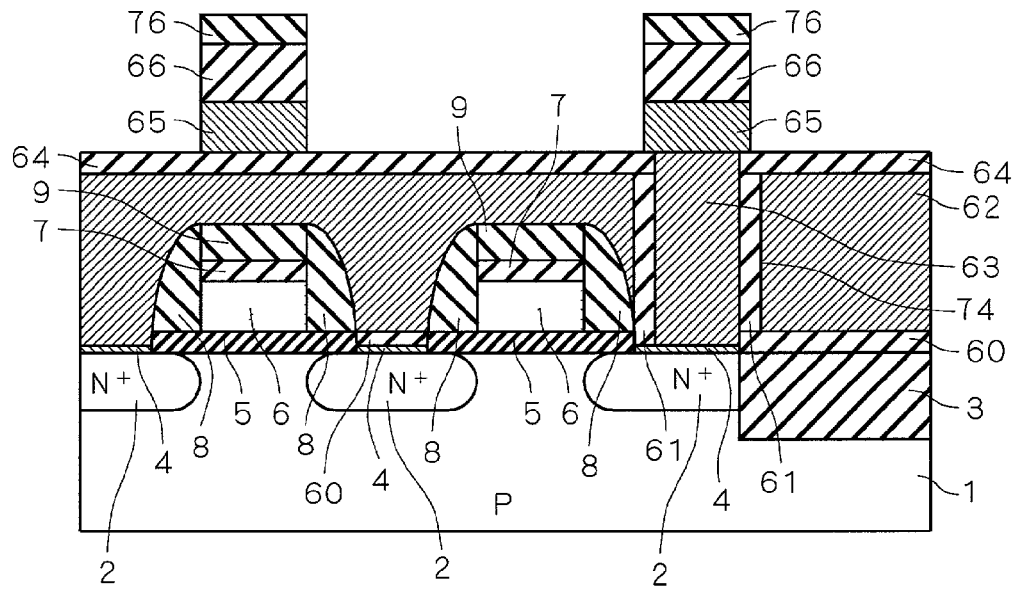

At a step shown in FIG. 23, subsequently, a TEOS film and a nitride film ($Si_3N_4$) are first deposited sequentially on the TEOS layer 71 and the wiring 65. Then, selective etching is carried out by using a mask. Consequently, the upper insulating film 66 and the nitride film 76 are formed on the wiring 65. During this process, the TEOS layer 71 is removed simultaneously.

Figure 24:
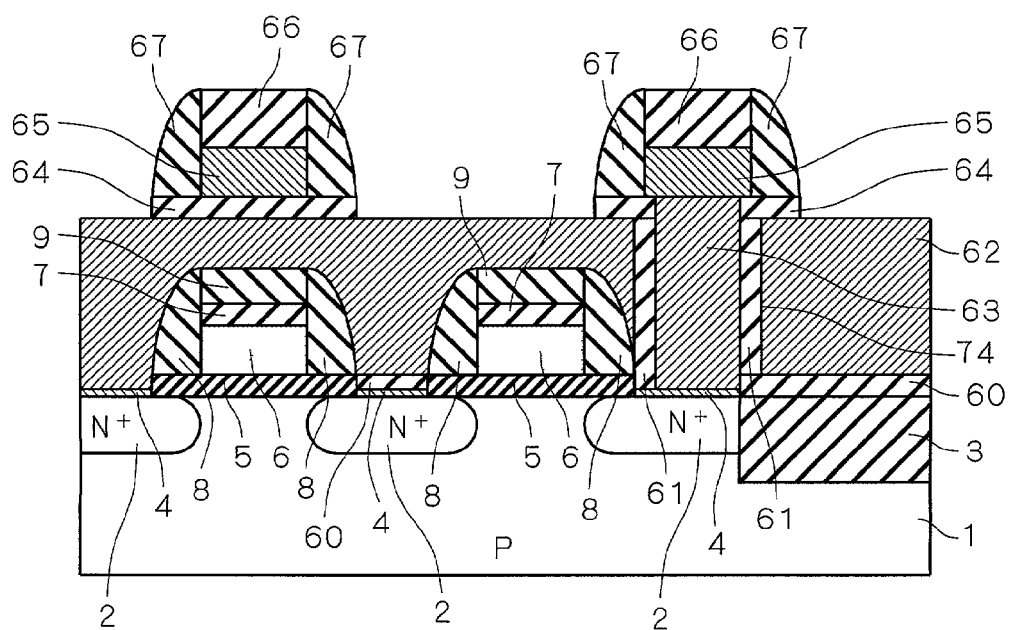

At a step shown in FIG. 24, then, a nitride film ($Si_3N_4$) is deposited to cover the upper surface of the conductor layer 62. The nitride film is deposited in such a thickness that the nitride film 76 is buried therein. Thereafter, the nitride film thus deposited is etched back. During this process, the nitride film 76 is removed simultaneously. Consequently, the side wall 67 is formed to cover the side surfaces of the wiring 65 and the upper insulating film 66. A portion of the insulating film 64 which is not covered with the wiring 65 and the side wall 67 is also removed simultaneously. As a result, the upper surface of the conductor layer 62 is selectively exposed.

Figure 25:
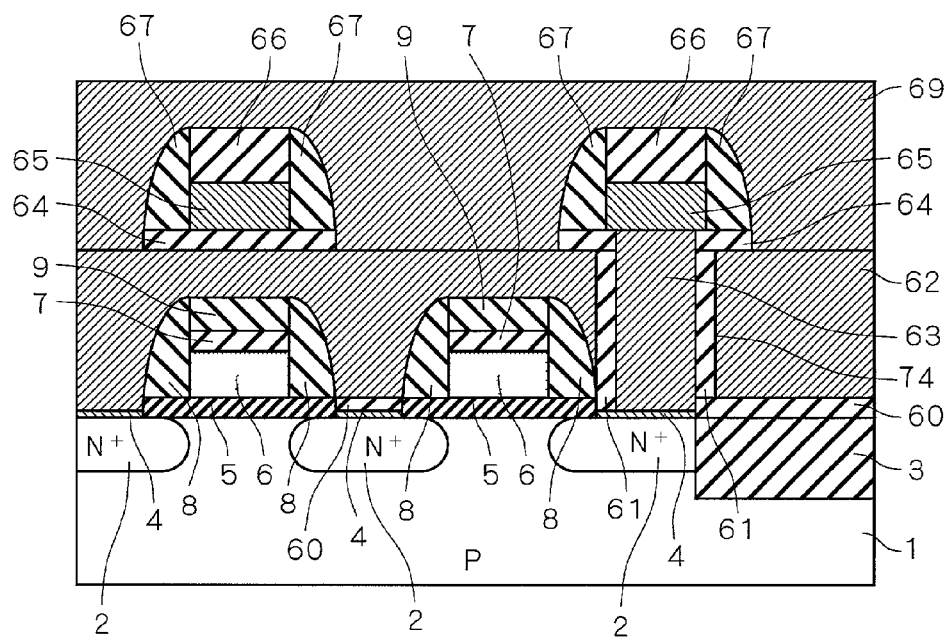

At a step shown in FIG. 25, subsequently, copper is first deposited to cover the upper surface of the conductor layer 62. Then, an upper surface of a copper layer is flattened by using the CMP so that the conductor layer 69 having a thickness of 500 nm is formed. The CMP is carried out such that the upper insulating film 66 is not exposed from the conductor layer 69.

Figure 26:
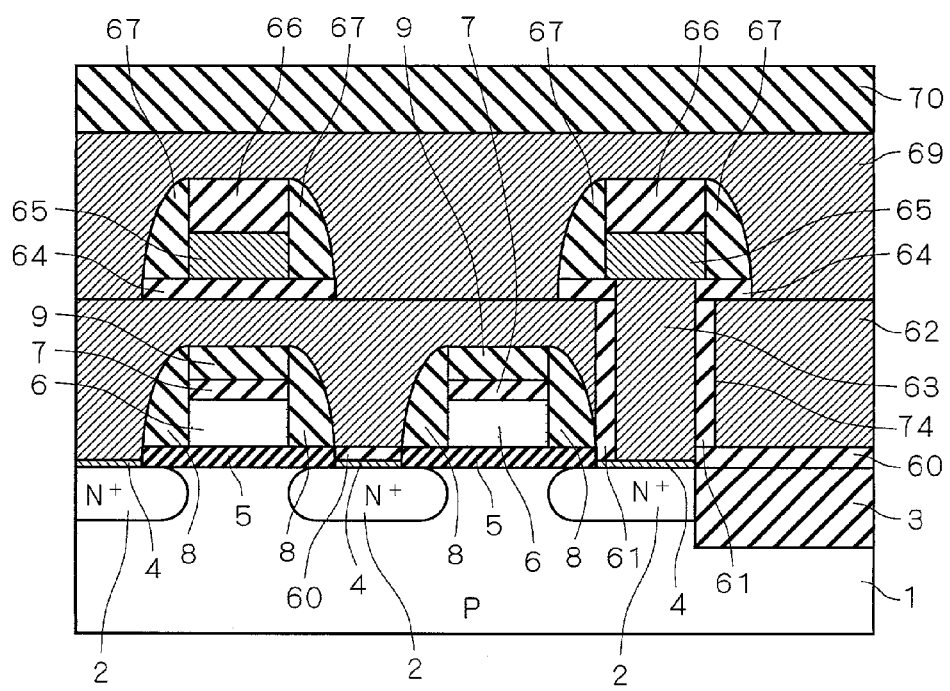
Figure 29:
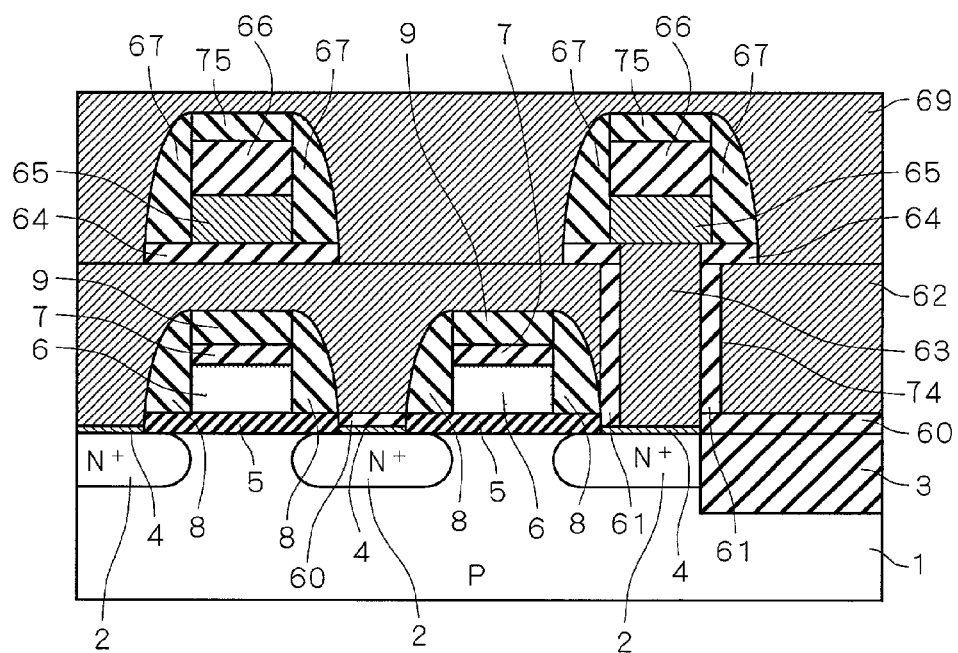
Figure 30:
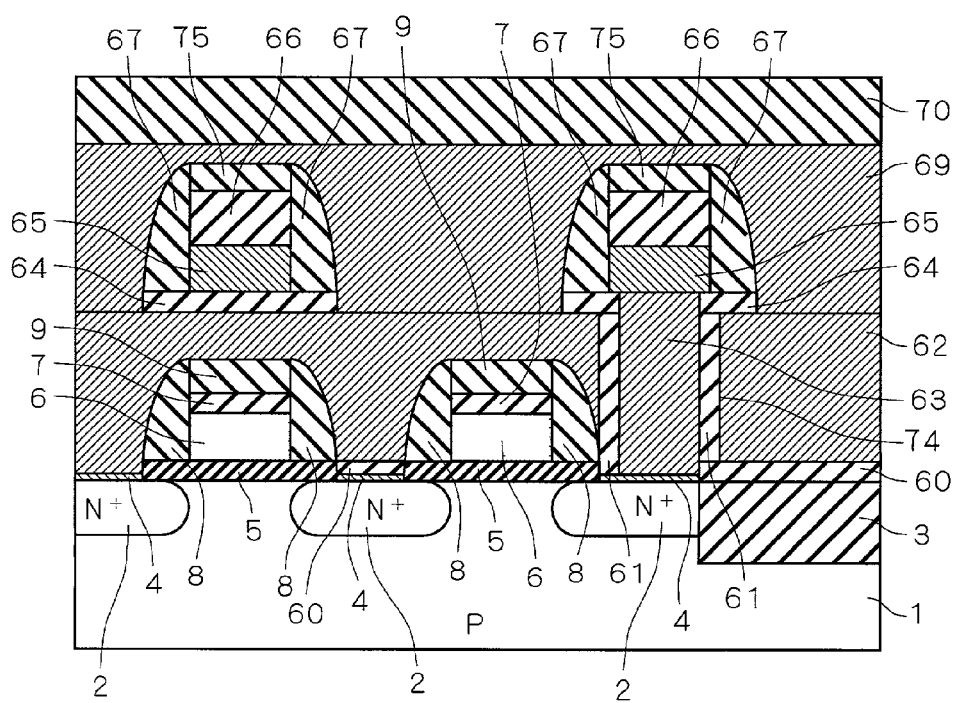

As shown in FIG. 26, preferably, the insulating film 70 being a nitride film ($Si_3N_4$) is then deposited on the conductor layer 69. Through the above-mentioned steps, the semiconductor device 102 shown in FIG. 14 is completed.

(Advantage of Second Embodiment)

Also in the semiconductor device 102 and the method of manufacturing the semiconductor device 102, the same effects as those in the semiconductor device 101 and the method of manufacturing the semiconductor device 101 can be obtained. Furthermore, a metal containing, as a main component, copper having a low electrical resistivity is used for the materials of the conductor layers 62 and 69. In comparison with the same dimension, therefore, the noise eliminating characteristic can further be enhanced.

In particular, the method of manufacturing the semiconductor device 102 described above employs the so-called damascene process so that a metal containing copper as a main component can be used for the materials of the conductor layers 62 and 69. Particularly, the side wall 8 exposed to a surface and the upper insulating film 9 in the insulator surrounding the wiring 6 are formed of the same material (a nitride). Therefore, the TEOS layer 72 formed of another material is used for a sacrificial layer and can be subjected to the patterning without damaging the insulator surrounding the wiring 6 at the step shown in FIG. 17. In other words, the contact hole 74 can be formed.

In order to further provide a wiring to be a third layer on the conductor layer 69 and to form, on the conductor layer 69, a contact hole for electrically connecting the wiring to be the third layer and the wiring 65 to be a second layer, it is preferable that the surface of the insulator surrounding the wiring 65 should be formed of the same material. FIGS. 27 to 30 are views showing a manufacturing process, illustrating a manufacturing method suitable for the purpose. The steps shown in FIGS. 27 to 30 are executed in place of the steps shown in FIGS. 23 to 26. In FIG. 27, a nitride film 76 is formed on a TEOS layer 71 more thickly than that in the step shown in FIG. 23. As a result, when a nitride film is deposited and is further etched back at the step shown in FIG. 28, a part of the nitride film 76 is not removed but remains as an upper insulating film 75 on the TEOS layer 71. Accordingly, the upper insulating film 75 also remains exactly on the finished semiconductor device 102 which is obtained by forming a conductor layer 69 at the step shown in FIG. 29 and further forming an insulating film 70 at the step shown in FIG. 30.

While the invention has been shown and described in detail, the foregoing description is in all aspects illustrative and not restrictive. It is therefore understood that numerous modifications and variations can be devised without departing from the scope of the invention.

What is claimed is:

1. A high-frequency semiconductor device comprising:
a semiconductor substrate having a main surface;
a first wiring provided over said main surface of said semiconductor substrate; and
a grounding conductor layer continuously covering a periphery of said first wiring with a first insulator interposed therebetween in a section crossing a direction of extension of said first wiring, wherein
said grounding conductor layer transmits a grounding potential and said grounding conductor layer includes a first portion constituted by only one unit covering an upper surface and two side surfaces of said first wiring and a second portion covering a bottom surface of said first wiring and
wherein said first wiring is electrically connected to said semiconductor substrate through a conductor plug filled in a through hole selectively formed in said grounding conductor layer with a side insulating film interposed therebetween in a part taken in said direction of extension of said first wiring.

* * * * *